(12) United States Patent
Kim

(10) Patent No.: US 10,684,796 B2
(45) Date of Patent: Jun. 16, 2020

(54) MEMORY SYSTEM AND OPERATING METHOD THEREOF

(71) Applicant: SK hynix Inc., Icheon (KR)

(72) Inventor: Do Hun Kim, Hwaseong (KR)

(73) Assignee: SK hynix Inc., Icheon (KR)

( * ) Notice: Subject to any disclaimer, the term of this patent is extended or adjusted under 35 U.S.C. 154(b) by 20 days.

(21) Appl. No.: 15/976,651

(22) Filed: May 10, 2018

(65) Prior Publication Data

US 2019/0129654 A1 May 2, 2019

(30) Foreign Application Priority Data

Oct. 27, 2017 (KR) ........................ 10-2017-0141380

(51) Int. Cl.
| | | |
|---|---|---|
| *G06F 3/06* | (2006.01) | |
| *G06F 11/10* | (2006.01) | |
| *G11C 29/52* | (2006.01) | |
| *G06F 12/10* | (2016.01) | |
| *G11C 29/04* | (2006.01) | |

(52) U.S. Cl.
CPC .......... *G06F 3/0659* (2013.01); *G06F 3/0604* (2013.01); *G06F 3/068* (2013.01); *G06F 11/1048* (2013.01); *G06F 11/1068* (2013.01); *G06F 12/10* (2013.01); *G06F 2212/1008* (2013.01); *G06F 2212/608* (2013.01); *G06F 2212/657* (2013.01); *G11C 29/52* (2013.01); *G11C 2029/0411* (2013.01)

(58) Field of Classification Search
CPC ...... G06F 3/0659; G06F 3/0604; G06F 3/068; G06F 11/1068; G06F 12/10; G06F 2212/1008; G06F 2212/608; G06F 2212/657; G11C 29/52
See application file for complete search history.

(56) References Cited

U.S. PATENT DOCUMENTS

| | | | |
|---|---|---|---|
| 5,509,132 A | | 4/1996 | Matsuda et al. |
| 5,604,753 A | * | 2/1997 | Bauer ................. G06F 11/1064 714/17 |
| 8,046,551 B1 | * | 10/2011 | Sahin .................. G06F 11/2074 711/162 |
| 8,909,860 B2 | | 12/2014 | Rao |
| 2011/0022779 A1 | * | 1/2011 | Lund .................... G06F 12/0246 711/103 |
| 2011/0047437 A1 | * | 2/2011 | Flynn ........................ G06F 9/52 714/758 |
| 2011/0072196 A1 | * | 3/2011 | Forhan .................... G06F 13/14 711/103 |
| 2012/0144448 A1 | * | 6/2012 | Gunawardena ..... G06F 16/1752 726/1 |
| 2013/0205097 A1 | * | 8/2013 | Flynn .................. G06F 12/0246 711/142 |
| 2014/0297603 A1 | * | 10/2014 | Kim .................... G06F 16/1752 707/692 |

(Continued)

*Primary Examiner* — Kyle Vallecillo

(57) ABSTRACT

There are provided a memory system and an operating method thereof. In a method for operating a memory system, the method includes generating a write request for write data; reading chunk data from a buffer memory in response to the write request; caching the chunk data in a cache memory; generating a read request for read data; and outputting a portion of the cached chunk data as the read data from the cache memory when the read data is included in the cached chunk data.

15 Claims, 13 Drawing Sheets

(56) References Cited

U.S. PATENT DOCUMENTS

| | | | |
|---|---|---|---|
| 2015/0356019 A1* | 12/2015 | Johar | G06F 12/0871 |
| | | | 711/142 |
| 2015/0370734 A1* | 12/2015 | Mangano | G06F 3/0619 |
| | | | 709/212 |
| 2016/0006461 A1* | 1/2016 | Yin | G06F 11/1012 |
| | | | 714/766 |
| 2017/0031626 A1* | 2/2017 | Kim | G06F 3/0656 |
| 2018/0004698 A1* | 1/2018 | Brouwer | G06F 13/4068 |
| 2018/0006963 A1* | 1/2018 | Brouwer | H04L 47/801 |
| 2018/0130537 A1* | 5/2018 | Kim | G06F 12/0802 |
| 2019/0129971 A1* | 5/2019 | Hironaka | G06F 16/1752 |

\* cited by examiner

MEMORY SYSTEM AND OPERATING METHOD THEREOF

CROSS-REFERENCE TO RELATED APPLICATION

The present application claims priority under 35 U.S.C. § 119(a) to Korean patent application number 10-2017-0141380 filed on Oct. 27, 2017, the entire disclosure of which is incorporated herein by reference.

BACKGROUND

1. Field of Invention

An embodiment of the present disclosure relates to a memory system and an operating method thereof, and particularly, to a memory system configured to read data stored in a buffer memory device at a high speed and an operating method of the memory system.

2. Description of Related Art

A nonvolatile memory device may include a plurality of memory blocks. In addition, each memory block may include a plurality of memory cells, and an erase operation may be performed on memory cells included in one memory block.

When a memory system receives a write command and a logical address, which are input from a host, the memory system may allocate a physical address corresponding to the logical address, and write data to a storage area of a nonvolatile memory device corresponding to the physical address.

The memory system may store, in a buffer memory device, physical-logical address mapping information including a mapping relationship between logical and physical addresses. Also, when a read command is received from the host, the memory system may read data stored in the nonvolatile memory device and output the read data to the host, based on the physical-logical address mapping information stored in the buffer memory device.

SUMMARY

Embodiments provide a memory system capable of reading data stored in a buffer memory device at a high speed and an operating method of the memory system.

According to an embodiment of the present disclosure, there is provided a method for operating a memory system, the method including generating a write request for write data; reading chunk data from a buffer memory in response to the write request; caching the chunk data in a cache memory; generating a read request for read data; and outputting a portion of the cached chunk data as the read data from the cache memory when the read data is included in the cached chunk data.

According to an embodiment of the present disclosure, there is provided a method for operating a memory system, the method including generating a write request for write data; reading first chunk data from a buffer memory in response to the write request and caching the read first chunk data in a cache memory; generating a read request for read data; reading second chunk data from the buffer memory in response to the read request and caching the read second chunk data in the cache memory; outputting a portion of the cached second chunk data as the read data; modifying the cached first chunk data, based on the write data; and writing the modified first chunk data in the buffer memory after outputting the read data.

According to an embodiment of the present disclosure, there is provided a memory system including a host interface configured to receive data and a logical address from a host; a nonvolatile memory device configured to store the data in a storage area corresponding to a physical address mapped to the logical address; a buffer memory device configured to store mapping information between the logical address and the physical address; a cache memory configured to cache the mapping information; and a processor configured to control the buffer memory device and the cache memory.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain illustrative embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
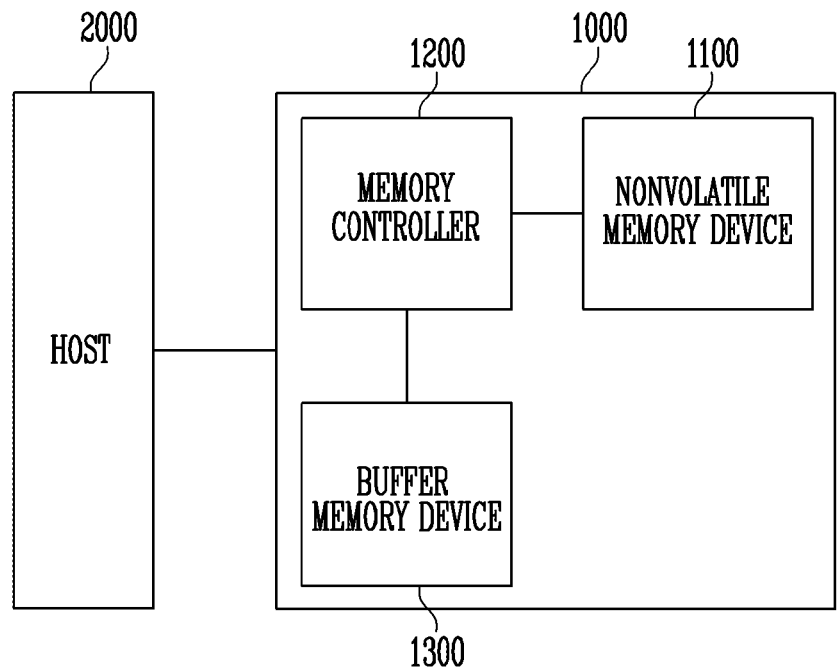
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a nonvolatile memory device 1100 that retains stored data even when power is cut off, a buffer memory device 1300 for temporarily storing data, and a memory controller 1200 that controls the nonvolatile memory device 1100 and the buffer memory device 1300 under the control of a host 2000.

The host 2000 may communicate with the memory system 1000, in at least one of various communication manners, such as using one or more of a Universal Serial Bus (USB), a Serial AT Attachment (SATA), a High Speed InterChip (HSIC), a Small Computer System Interface (SCSI), Firewire, a Peripheral Component Interconnection (PCI), a PCI Express (PCIe) interface, a NonVolatile Memory Express (NVMe) interface, a Universal Flash Storage (UFS) interface, a Secure Digital (SD) interface, a MultiMedia card (MMC) interface, an Embedded MMC (eMMC) interface, a Dual In-line Memory Module (DIMM) interface, a Registered DIMM (RDIMM) interface, a Load Reduced DIMM (LRDIMM) interface, and the like.

The memory controller 1200 may control overall operations of the memory system 1000, and control data exchange between the host 2000 and the nonvolatile memory device 1100. For example, the memory controller 1200 may program or read data by controlling the nonvolatile memory device 1100 in response to a request of the host 2000. Also, the memory controller 1200 may store information of main memory blocks and sub-memory blocks, which are included in the nonvolatile memory device 1100, and control the nonvolatile memory device 1100 to perform a program operation on a main memory block or a sub-memory block according to the amount of data loaded for the program operation. In some embodiments, the nonvolatile memory device 1100 may include a flash memory.

The memory controller 1200 may control data exchange between the host 2000 and the buffer memory device 1300 or temporarily store system data for controlling the nonvolatile memory device 1100 in the buffer memory device 1300. The buffer memory device 1300 may function as a working memory, a cache memory, or a buffer memory of the memory controller 1200. The buffer memory device 1300 may store codes and commands, which are executed by the memory controller 1200. Also, the buffer memory device 1300 may store data processed by the memory controller 1200.

The memory controller 1200 may temporarily store data input from the host 200 in the buffer memory device 1300 and then transfer the data temporarily stored in the buffer memory device 1300 to the nonvolatile memory device 1100, thereby storing the transferred data in the nonvolatile memory device 1100.

In some embodiments, the buffer memory device 1300 may include a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), etc.

In some embodiments, the memory system 1000 may not include the buffer memory device 1300. In another embodiment, the buffer memory device 1300 may be embedded in the memory controller 1200. The buffer memory device 1300 may be referred to as a buffer memory, when the buffer memory device 1300 is configured separately from the memory controller 1200 or when the buffer memory device 1300 is embedded in the memory controller 1200.

Figure 2:
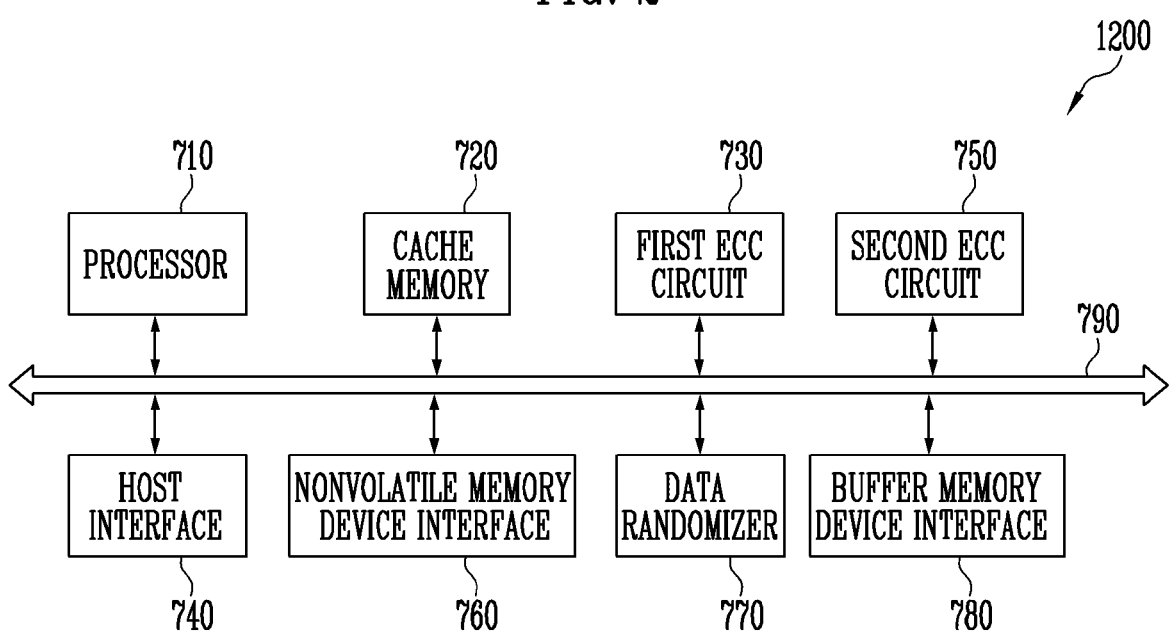
FIG. 2 is a diagram illustrating a memory controller of FIG. 1 according to an embodiment.

FIG. 2 is a diagram illustrating the memory controller 1200 of FIG. 1 according to an embodiment.

Referring to FIG. 2, the memory controller 1200 may include a processor 710, a cache memory 720, a first error-correcting code (ECC) circuit 730, a host interface 740, a second ECC circuit 750, a nonvolatile memory device interface 760, a data randomizer 770, a buffer memory device interface 780, and a bus 790.

The bus 790 may be configured to provide channels between components of the memory controller 1200.

Referring to FIGS. 1 and 2, the host interface 740 is configured to communicate with the external host 2000 under the control of the processor 710. As an example, the host interface 740 may receive a write command, data, and a logical address corresponding to the write command from the host 2000. Also, the host interface 740 may receive a read command and a logical address corresponding to the read command from the host 2000.

The host interface 740 may be configured to communicate with the host 2000, in at least one of various communication manners, such as using one or more of a Universal Serial Bus (USB), a Serial AT Attachment (SATA), a High Speed InterChip (HSIC), a Small Computer System Interface (SCSI), Firewire, a Peripheral Component Interconnection (PCI), a PCI Express (PCIe) interface, a NonVolatile Memory Express (NVMe) interface, a Universal Flash Storage (UFS) interface, a Secure Digital (SD) interface, a MultiMedia card (MMC) interface, an Embedded MMC (eMMC) interface, a Dual In-line Memory Module (DIMM) interface, a Registered DIMM (RDIMM) interface, and a Load Reduced DIMM (LRDIMM) interface.

The processor 710 may control overall operations of the memory controller 1200, and perform one or more logical operations. The processor 710 may communicate with the external host 2000 through the host interface 740, and communicate with the nonvolatile memory device 1100 through the nonvolatile memory device interface 760. Also, the processor 710 may communicate with the buffer memory device 1300 through the buffer memory device interface 780. Also, the processor 710 may control the cache memory 720.

The processor 710 may queue a plurality of commands input from the host 2000. Such an operation is referred to as a multi-queue. The processor 710 may sequentially transfer the plurality of queued commands to the nonvolatile memory device 1100.

The memory system 1000 may receive a write command, write data, and a logical address corresponding to the write command from the host 2000 through the host interface 740. The processor 710 may allocate a physical storage area of the nonvolatile memory device 1100, in which the write data is to be stored, in response to the write command. In other words, the processor 710 may map a physical address corresponding to the logical address input from the host 2000 in response to the write command. At this time, the physical address may be an address corresponding to the physical storage area of the nonvolatile memory device 1100 in which the write data input from the host 2000 is to be stored.

The processor 710 may store, in the nonvolatile memory device 1100, mapping information between the logical address and the physical address, i.e., logical-physical address mapping information. Also, when the processor 710 is powered up, the processor 710 may load the logical-physical address mapping information stored in the nonvolatile memory device 1100 into the buffer memory device 1300.

The processor 710 may modify at least a portion of the logical-physical address mapping information stored in the buffer memory device 1300 in response to the write command, the write data, and the logical address. Also, the processor 710 may re-store the modified logical-physical address mapping information, which has been stored in the buffer memory device 1300, in the nonvolatile memory device 1100.

The memory system 1000 may receive a read command and a logical address corresponding to the read command from the host 2000 through the host interface 740. The processor 710 may determine a physical address corresponding to the logical address from the logical-physical address mapping information stored in the buffer memory device 1300 in response to the read command. The processor 710 may read data stored in a storage area of the nonvolatile memory device 1100, which corresponds to the physical address, and then output the read data to the host 2000.

As another example, the memory system 1000 may receive a read command and a logical address corresponding to the read command from the host 2000 through the host interface 740. The processor 710 may load logical-physical address mapping information stored in the nonvolatile memory device 1100 to the buffer memory device 1300, in response to the read command. Then, the memory system 1000 may determine a physical address corresponding to the logical address from the logical-physical address mapping information stored in the buffer memory device 1300, and read data stored in the storage area of the nonvolatile memory device 1100, which corresponds to the physical address, and then output the read data to the host 2000.

The cache memory 720 may store codes and commands, which are executed by the processor 710. The cache memory 720 may store data processed by the processor 710. The cache memory 720 may include a Static RAM (SRAM) or a Dynamic RAM (DRAM).

The first ECC circuit 730 may perform an error correction operation. The first ECC circuit 730 may perform ECC encoding on data to be written in the nonvolatile memory device 1100 through the nonvolatile memory device interface 760. The ECC-encoded data may be transferred to the nonvolatile memory device 1100 through the nonvolatile memory device interface 760. The first ECC circuit 730 may perform ECC decoding on data received from the nonvolatile memory device 1100 through the nonvolatile memory device interface 760. As an example, the first ECC circuit 730 may be a component of the nonvolatile memory device interface 760.

The first ECC circuit 730 may perform an ECC operation, based on a Bose, Chaudhuri, and Hocquenghem (BCH) code. As another example, the first ECC circuit 730 may perform an ECC operation, based on a Low Density Parity Check (LDPC) code.

The second ECC circuit 750 may perform an error correction operation. The second ECC circuit 750 may perform ECC encoding on data to be written in the buffer memory device 1300 through the buffer memory device interface 780. The ECC-encoded data may be transferred to the buffer memory device 1300 through the buffer memory device interface 780. The second ECC circuit 750 may perform ECC decoding on data received from the buffer memory device 1300 through the buffer memory device interface 780. As an example, the second ECC circuit 750 may be a component of the buffer memory device interface 780.

The second ECC circuit 750 may perform an ECC operation, based on a Hamming code. As another example, the second ECC circuit 750 may perform an ECC operation, based on a Bose, Chaudhuri, and Hocquenghem (BCH) code.

The nonvolatile memory device interface 760 is configured to communicate with the nonvolatile memory device 1100 under the control of the processor 710. The nonvolatile memory device interface 760 may communicate a command, an address, and data with the nonvolatile memory device 1100 through one or more channels.

As an example, the processor 710 may control an operation of the memory controller 1200, using codes. The processor 710 may load codes from a nonvolatile memory device, e.g., a Read Only Memory (RAM), provided in the memory controller 1200. As another example, the processor 710 may load codes from the nonvolatile memory device 1100 through the nonvolatile memory device interface 760.

The data randomizer 770 may randomize data or derandomize the randomized data. The data randomizer 770 may perform a data randomizing operation on data to be written in the nonvolatile memory device 1100 through the nonvolatile memory device interface 760. The randomized data may be transferred to the nonvolatile memory device 1100 through the nonvolatile memory device interface 760. The data randomizer 770 may perform a data derandomizing operation on data received from the nonvolatile memory device 1100 through the nonvolatile memory device interface 760.

Also, the data randomizer 770 may perform a data randomizing operation on data to be written in the buffer memory device 1300 through the buffer memory device interface 780. The randomized data may be transferred to the buffer memory device 1300 through the buffer memory device interface 780. The data randomizer 770 may perform a data derandomizing operation on data received from the buffer memory device 1300 through the buffer memory device interface 780.

As an example, the bus 790 of the memory controller 1200 may include a control bus and a data bus. The data bus may be configured to transfer data in the memory controller 1200, and the control bus may be configured to transfer control information such as a command and an address in the memory controller 1200. The data bus and the control bus are separated from each other, and may not interfere or influence with each other. The bus 790 may be coupled to the processor 710, the cache memory 720, the first ECC circuit 730, the host interface 740, the second ECC circuit 750, the nonvolatile memory device interface 760, the data randomizer 770, and the buffer memory device interface 780.

The buffer memory device interface 780 may be configured to communicate with the buffer memory device 1300 under the control of the processor 710. The buffer memory device interface 780 may communicate a command, an address, and data with the buffer memory device 1300 through one or more of channels.

The cache memory 720 may cache logical-physical address mapping information stored in the buffer memory device 1300. When data is written in the buffer memory device 1300, the cache memory 720 may temporarily store the written data. Also, when data stored in the buffer memory device 1300 is read, the cache memory 720 may temporarily store the read data.

The processor 710 may allocate a physical address corresponding to a logical address in response to a write command and the logical address, which are input from the host 2000, and modify at least a portion of logical-physical address mapping information. Also, the processor 710 may temporarily store the modified logical-physical address mapping information in the cache memory 720 to write the logical-physical address mapping information in the buffer memory device 1300. In other words, the cache memory 720 may temporarily store the modified logical-physical address mapping information before the logical-physical address mapping information is written in the buffer memory device 1300, under the control of the processor 710.

Also, the processor 710 may perform an ECC encoding operation on the logical-physical address mapping information cached in the cache memory 720 using the second ECC circuit 750, or perform a data randomizing operation on the logical-physical address mapping information cached in the cache memory 720 using the data randomizer 770. The processor 710 may write the ECC-encoded or data-randomized logical-physical address mapping information in the buffer memory device 1300.

The processor 710 may read logical-physical address mapping information corresponding to a logical address from the buffer memory device 1300 in response to a read command and the logical address, which are input from the host 2000. The processor 710 may perform an ECC decoding operation on the read logical-physical address mapping information using the second ECC circuit 750, or may perform a data derandomizing operation on the read logical-physical address mapping information using the data randomizer 770.

Also, the processor 710 may cache logical-physical address mapping information read from the buffer memory device 1300. In other words, the cache memory 720 may temporarily store the read logical-physical address mapping information under the control of the processor 710.

The processor 710 may read data stored in the nonvolatile memory device 1100, based on the error-decoded or data-derandomized logical-physical address mapping information.

Figure 3:
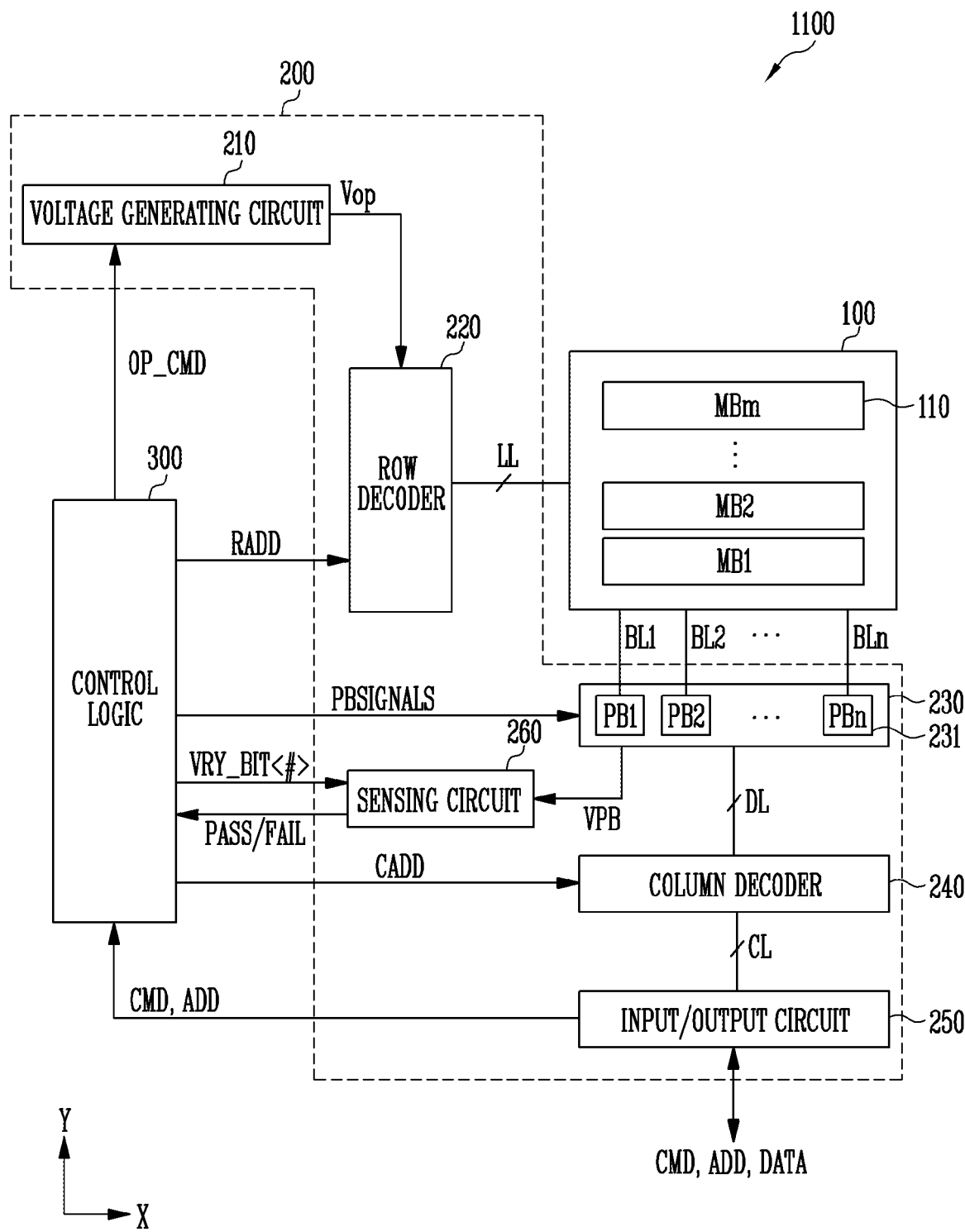
FIG. 3 is a diagram illustrating a nonvolatile memory device of FIG. 1 according to an embodiment.

FIG. 3 is a diagram illustrating the nonvolatile memory device 1100 of FIG. 1 according to an embodiment.

Referring to FIG. 3, the nonvolatile memory device 1100 may include a memory cell array 100 that stores data. The nonvolatile memory device 1100 may include peripheral circuits 200 configured to perform a program operation for storing data in the memory cell array 100, a read operation for outputting the stored data, and an erase operation for erasing the stored data. The nonvolatile memory device 1100 may include a control logic 300 that controls the peripheral circuits 200 under the control of a memory controller (e.g., the memory controller 1200 of FIG. 1).

The memory cell array 100 may include a plurality of memory blocks MB1 to MBm (m is a positive integer), each memory block 110 including a plurality of memory cells. Local lines LL and bit lines BL1 to BLn (n is a positive integer) may be coupled to the memory blocks MB1 to MBm. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipe lines. The local lines LL may be coupled to the memory blocks MB1 to MBm, respectively, and the bit lines BL1 to BLn may be commonly coupled to the memory blocks MB1 to MBm. The memory blocks MB1 to MBm may be implemented in a two-dimensional or three-dimensional structure. For example, memory cells may be arranged in a direction parallel to a top surface of a substrate in the memory blocks MB1 to MBm having a two-dimensional structure. For example, memory cells may be arranged in a direction vertical to a surface (e.g., a top surface) of a substrate in the memory blocks MB1 to MBm having a three-dimensional structure.

The peripheral circuits 200 may be configured to perform program, read, and erase operations of a selected memory block 110 under the control of the control logic 300. For example, the peripheral circuits 200, under the control of the control logic 300, may supply verify and/or pass voltages to one or more of the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn coupled to the bit lines BL1 to BLn. For example, each page buffer 231 may be coupled to a corresponding one of the bitlines BL1 to BLn. The page buffers PB1 to PBn may operate in response to page buffer control signals PBSIGNALS. For example, the page buffers PB1 to PBn may temporarily store data received through the bit lines BL1 to BLn, respectively, or sense voltages or currents of the bit lines BL1 to BLn in a read operation or a verify operation, respectively.

The column decoder 240 may transfer data between the input/output circuit 250 and the page buffer group 230 in response to a column address CADD. For example, the column decoder 240 may exchange data with the page buffers PB1 to PBn through data lines DL, or exchange data with the input/output circuit 250 through column lines CL.

The input/output circuit 250 may transfer a command CMD and an address ADD, which are received from the memory controller (e.g., the memory controller 1200 of FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

In an operation of the non-volatile memory device 1100, each memory block 110 may be a unit of an erase operation. In other words, an erase operation may be performed on each memory block 110 such that a plurality of memory cells included in the memory block 110 are simultaneously erased, and individual memory cells in the plurality of memory cells may not be selectively erased.

Figure 4:
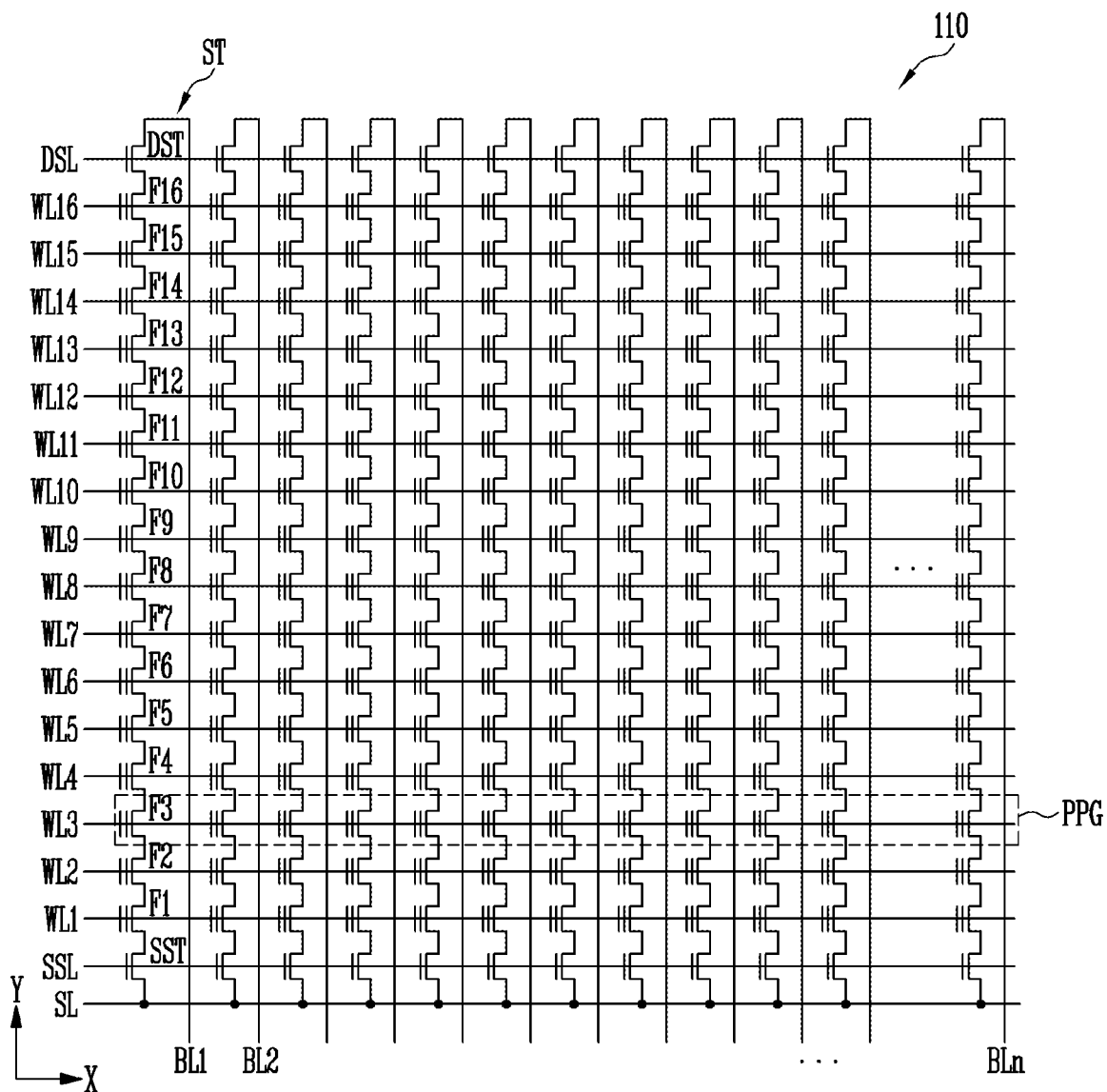
FIG. 4 is a diagram illustrating a memory block of FIG. 3 according to an embodiment.

FIG. 4 is a diagram illustrating the memory block (or a first memory block) 110 of FIG. 3 according to an embodiment.

Referring to FIG. 4, a plurality of word lines arranged in parallel to one another between a first select line and a second select line may be coupled to the first memory block 110. Here, the first select line may be a source select line SSL, and the second select line may be a drain select line DSL. More specifically, the first memory block 110 may include a plurality of strings ST coupled between respective bit lines BL1 to BLn and a source line SL. The bit lines BL1 to BLn may be coupled to the strings ST, respectively, and the source line SL may be commonly coupled to the strings ST. The strings ST may be configured substantially identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which number is larger than that of the memory cells F1 to F16 shown in FIG. 4 may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be commonly coupled to the source select line SSL, gates of drain select transistors DST included in different strings ST may be commonly coupled to the drain select line DSL, gates of a group of the memory cells F1 to F16 included in different strings ST may be commonly coupled to a corresponding one of plurality of word lines WL1 to WL16. A group of memory cells (e.g., the memory cells F3) that are coupled to the same word line and included in different strings ST may be a physical page PPG. Therefore, a number of physical pages PPG corresponds to that of the word lines WL1 to WL16 in the first memory block 110.

One memory cell MC may store data of one bit. This is generally called as a single level cell (SLC). In this case, one physical page PPG may store one logical page (LPG) data. The one LPG data may include data bits of which number corresponds to that of cells included in one physical page PPG. In addition, one memory cell MC may store data of two or more bits. This is generally called as a multi-level cell (MLC). In this case, one physical page PPG may store two or more LPG data.

When the memory cell stores data of two bits, one physical page PPG may include two pages PG. At this time, one page PG may store one LPG data. One memory cell may have any one of a plurality of threshold voltages according to the stored data, and a plurality of pages PG included in one physical page PPG may be expressed using a difference in threshold voltages.

A plurality of memory cells included in one physical page PPG may be simultaneously programmed. In other words, a nonvolatile memory device (e.g., the nonvolatile memory device 1100 of FIG. 3) may perform a program operation in units of physical pages PPG. A plurality of memory cells included in one memory block 110 may be simultaneously erased. In other words, the nonvolatile memory device 1100 may perform an erase operation in units of memory blocks 110. As an example, in order to update a portion of data stored in a first memory block, after the entire data stored in the first memory block is read and data required to be updated among the entire data is modified, the entire data may be again programmed in a second memory block.

Figure 5:
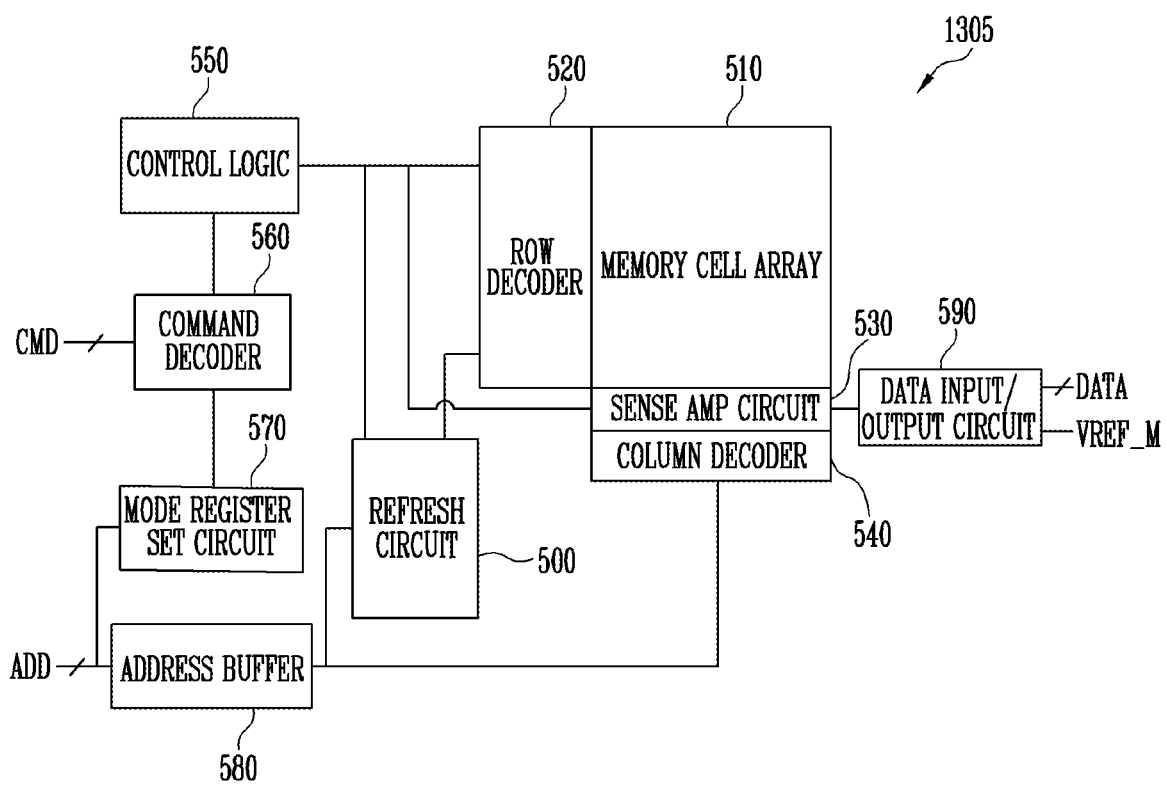
FIG. 5 is a diagram illustrating a Dynamic Random Access Memory (DRAM) according to an embodiment.

FIG. 5 is a diagram illustrating a DRAM 1305 according to an embodiment.

Referring to FIG. 5, a buffer memory device (e.g., the buffer memory device 1300 of FIG. 1) may include at least one DRAM 1305. The DRAM 1305 may include a memory cell array 510, a row decoder 520, a sense amplifier circuit (or a sense amp circuit) 530, a column decoder 540, a control logic 550, a command decoder 560, a mode register set (MRS) circuit 570, an address buffer 580, a data input/output circuit 590, and a refresh circuit 500.

The memory cell array 510 is a data storage in which a plurality of memory cells are arranged in row and column directions. The memory cell array 510 may include a plurality of DRAM memory cells, and data stored in the DRAM memory cell may disappear when power is cut off. The sense amp circuit 530 may read data stored in the memory cell array 510 by sensing and amplifying a voltage difference between a bit line pair, based on the distribution of charges stored in a selected memory cell.

Data DATA input through the data input/output circuit 590 is written in the memory cell array 510, based on an address ADD. The data DATA read from the memory cell array 510 based on the address ADD is output to one or more circuit elements outside the DRAM 1305 through the data input/output circuit 590. The address ADD is input to the address buffer 580 to designate a memory where data is to be written or read. The address buffer 580 temporarily stores the address ADD input from the outside.

The data input/output circuit 590 may receive a reference voltage VREF_M input from an external device through a memory reference voltage pad (not shown). The reference voltage VREF_M may be a voltage for determining whether a data signal indicates a logic high value or a logic low value.

The row decoder 520 decodes a row address in the address ADD output from the address buffer 580, to designate a word line coupled to a memory cell where data is to be input or output. That is, the row decoder 520 enables a corresponding word line by decoding the row address output from the address buffer 580 in a data write mode or a data read mode.

The column decoder 540 decodes a column address in the address ADD output from the address buffer 580, to designate a bit line coupled to a memory cell where data is to be input or output.

The command decoder 560 receives a command signal CMD applied from the outside, and decode the command signal CMD, thereby internally generating the decoded command signal. The MRS circuit 570 sets an internal mode register in response to the address ADD and an MRS command for designating an operation mode of the DRAM 1305. The control logic 550 may control an operation of the buffer memory device 1300 of FIG. 1 in response to a command output from the command decoder 560. For example, the decoded command signal by the command decoder 560 includes the MRS command and the command output from the command decoder 560.

The refresh circuit 500 may control a refresh operation of data stored in each of the DRAM memory cells included in the memory cell array 510.

In addition, although not shown in FIG. 5, the DRAM 1305 may further include a clock circuit generating a clock signal, a power circuit receiving a power voltage applied from the outside and generating an internal voltage based on the received power voltage or distributing at least one of the generated internal voltage and the received power voltage, and the like.

Figure 6:
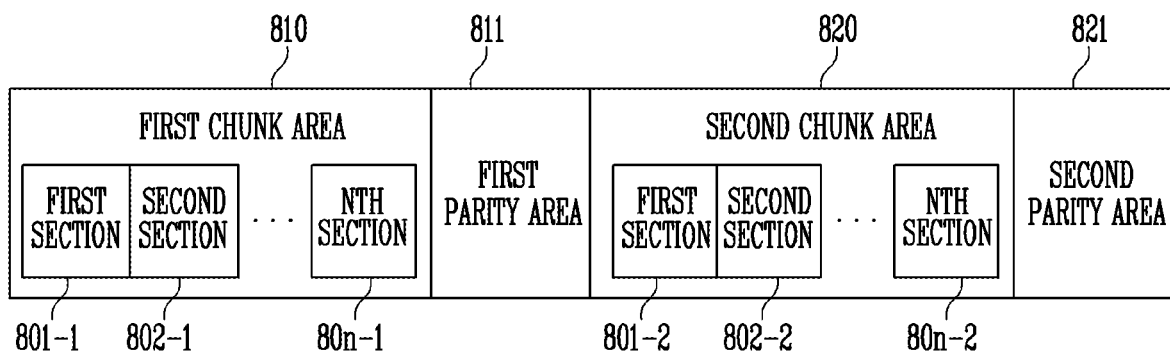
FIG. 6 is a diagram illustrating a data and parity storage area of a buffer memory device according to an embodiment of the present disclosure.

FIG. 6 is a diagram illustrating a data and parity storage area of a buffer memory device (e.g., the buffer memory device 1300 of FIG. 1) according to an embodiment of the present disclosure.

Referring to FIG. 6, a memory cell array (e.g., the memory cell array 510 of FIG. 5) of the buffer memory device 1300 may include first and second chunk areas 810 and 820 and first and second parity areas 811 and 821. In addition, the first chunk area 810 may include first to nth sections 801-1 to 80n-1, and the second chunk area 820 may include first to nth sections 801-2 to 80n-2.

First chunk data may be stored in the first chunk area 810, and first parity data generated by performing an ECC encoding operation on the first chunk data using an ECC circuit (e.g., the second ECC circuit 750 of FIG. 2) may be stored in the first parity area 811. For example, the first chunk data may be physical-logical address mapping information on a nonvolatile memory device (e.g., the nonvolatile memory device 1100 of FIG. 3). In addition, second chunk data may be stored in the second chunk area 820, and second parity data generated by performing an ECC encoding operation on the second chunk data using the second ECC circuit 750 may be stored in the second parity area 821. In other words, the chunk data stored in the first and second chunk areas 810 and 820 may be a unit on which an ECC encoding operation or an ECC decoding operation is performed.

As an example, the chunk data stored in each of the first and second chunk areas 810 and 820 may have a size of 128 bytes. In addition, parity data corresponding to the chunk data of 128 bytes may have a size of 2 bytes. In other words, the second ECC circuit 750 may generate the parity data of 2 bytes by performing ECC encoding on the chunk data of 128 bytes.

When a write request for writing data in the first chunk area 810 of the buffer memory device 1300 is generated, the processor 710 may temporarily cache the data in the cache memory 720 and perform an ECC encoding operation on the data using the second ECC circuit 750. In other words, when a write request for writing data in the first chunk area 810 of the buffer memory device 1300 is generated from the processor 710, the cache memory 720 may temporarily cache data under the control of the processor 710, and the second ECC circuit 750 may perform an ECC encoding operation on the data cached in the cache memory 720 under the control of the processor 710.

At this time, the ECC-encoded data may include chunk data and parity data. The processor 710 may write the chunk data cached in the cache memory 720 in the first chunk area 810 of the buffer memory device 1300, and write the parity data in the first parity area 811.

When a write request for writing section data in the first section 801-1 of the first chunk area 810 of the buffer memory device 1300 is generated, the processor 710 may read chunk data stored in the first chunk area 810 and parity data stored in the first parity area 811, and perform an ECC decoding operation based on the read chunk data and parity data by controlling the second ECC circuit 750. Also, the processor 710 may cache the ECC-decoded chunk data in the cache memory 720. Then, the processor 710 may modify a portion of the cached chunk data corresponding to the first section 801-1 into the section data to be written. The processor 710 may perform an ECC encoding operation on the modified chunk data by controlling the second ECC circuit 750, and write the ECC-encoded chunk data and parity data respectively in the first chunk area 810 and the first parity area 811 of the buffer memory device 1300. As an example, data stored in each of the first to nth sections 801-1 to 80n-1 may have a size of 2 bytes. In other words, the processor 710 may perform a write operation or a read operation in a data unit having a size of 2 bytes in the buffer memory device 1300. When the processor 710 writes data (e.g., the section data corresponding to the first section 801-1) in a unit smaller than that of the ECC encoding in the buffer memory device 1300 as described above, the writing operation may be performed through a read-modify write operation.

When a read request for reading section data stored in the first section 801-1 of the first chunk area 810 of the buffer memory device 1300 is generated, the processor 710 may read chunk data stored in the first chunk area 810 and parity data stored in the first parity area 811, and perform an ECC decoding operation based on the read chunk data and parity data, using the second ECC circuit 750. In other words, the second ECC circuit 750 may perform an ECC decoding operation based on the read chunk data and parity data under the control of the processor 710.

Also, the processor 710 may cache the ECC-decoded chunk data in the cache memory 720. The cache memory 720 may output a portion of the cached data corresponding to the first section 801-1 as the section data to the processor 710 under the control of the processor 710.

Figure 7:
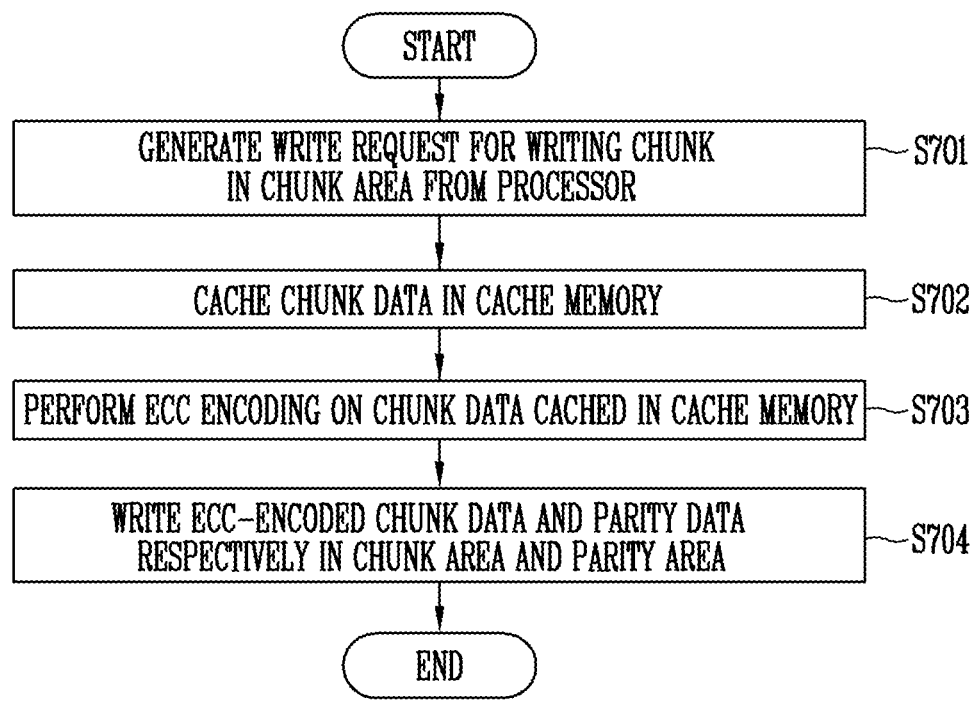
FIG. 7 is a flowchart illustrating a data writing method of a buffer memory device according to an embodiment of the present disclosure.

FIG. 7 is a flowchart illustrating a data writing method of a buffer memory device (e.g., the buffer memory device 1300 of FIG. 1) according to an embodiment of the present disclosure.

Referring to FIG. 7, at step S701, a processor (e.g., the processor 710 of FIG. 2) may generate a write request for writing chunk data in a chunk area (e.g., one of the chunk areas 810 and 820 of FIG. 6) of the buffer memory device 1300. At this time, the chunk data may have a data size corresponding to the storage capacity of each of the chunk areas 810 and 820.

The processor 710 may generate the write request for the buffer memory device 1300 when a data write command for the nonvolatile memory device 1100 is input from a host (e.g., the host 2000 of FIG. 1). When a write command for the nonvolatile memory device 1100, data, and a logical address are received from the host 2000, the memory system 1000 may allocate a physical address of the nonvolatile memory device 1100, which corresponds to the logical address, in response to the write command. The data input from the host 2000 may be written in a storage area corresponding to the physical address. For example, the processor 710 may generate a write request for writing logical-physical address mapping information including a mapping relationship between the logical address and the physical address in the buffer memory device 1300.

At step S702, chunk data may be cached in the cache memory 720 in response to the write request generated at step S701.

Then, at step S703, an ECC encoding operation may be performed on the chunk data cached in the cache memory 720. The ECC encoding operation may be performed by an ECC circuit (e.g., the second ECC circuit 750 of FIG. 2). In addition, the ECC-encoded data may include chunk data and parity data. At step S704, the ECC-encoded chunk data and parity data may be respectively written in a chunk area (e.g., one of the chunk areas 810 and 820) and a corresponding parity area (e.g., one of the parity areas 811 and 821) of the buffer memory device 1300.

Figure 8:
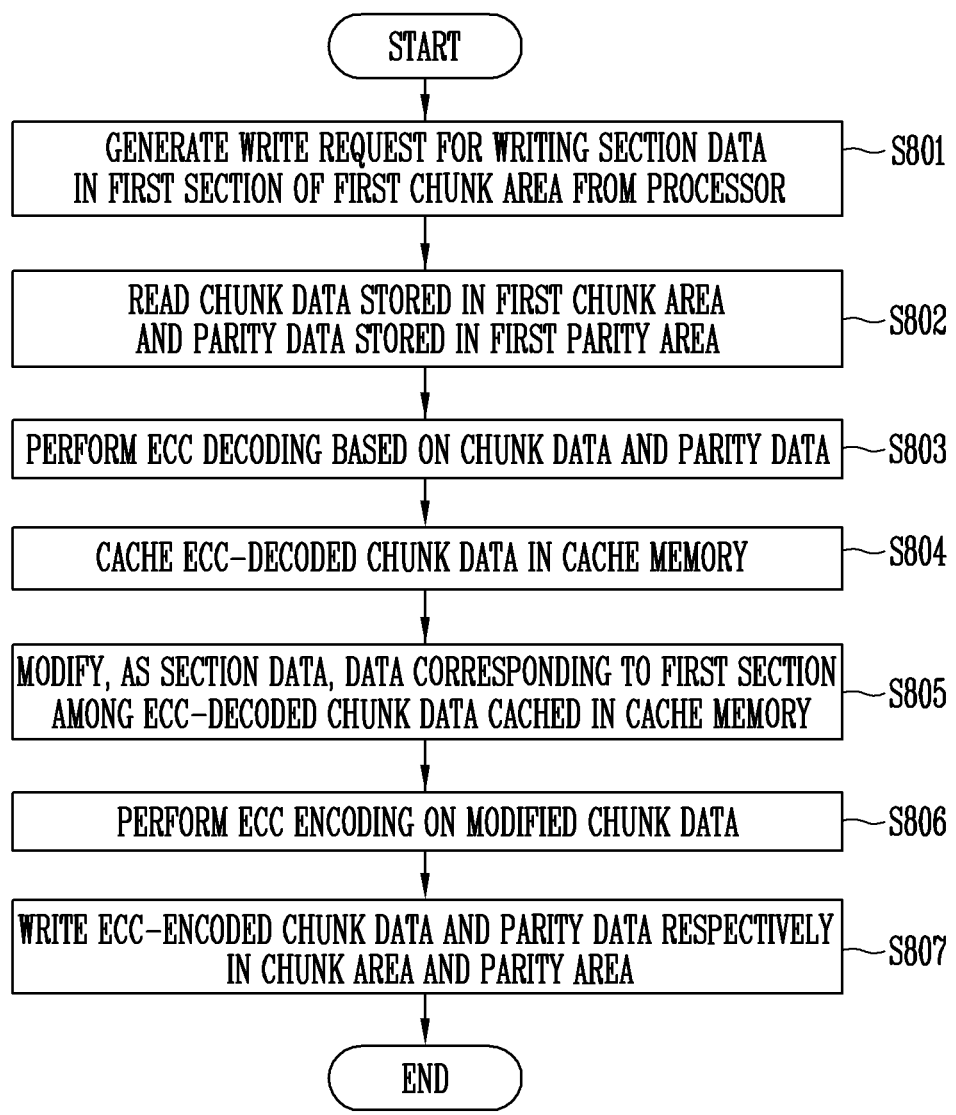
FIG. 8 is a flowchart illustrating a data writing method of a buffer memory device according to an embodiment of the present disclosure.

FIG. 8 is a flowchart illustrating a data writing method of a buffer memory device (e.g., the buffer memory device 1300 of FIG. 1) according to an embodiment of the present disclosure.

Referring to FIG. 8, at step S801, a processor (e.g., the processor 710 of FIG. 2) may generate a write request for writing section data (or write data) in a section (e.g., the first section 801-1 of FIG. 6) of a chunk area (e.g., the first chunk area 810 of FIG. 6) of the buffer memory device 1300. At step S802, the processor 710 may read chunk data stored in the first chunk area 810 of the buffer memory device 1300 and parity data stored in the first parity area 811 in response to the write request.

At step S803, an ECC circuit (e.g., the second ECC circuit 750 of FIG. 2) may perform an ECC decoding operation based on the read chunk data and the read parity data under the control of the processor 710. At step S804, the cache memory 720 caches the ECC-decoded chunk data under the control of the processor 710.

At step S805, the processor 710 may modify a portion of the cached chunk data corresponding to the first section 801-1 into the section data. At step S806, the second ECC circuit 750 may perform an ECC encoding operation on the modified chunk data including the section data under the control of the processor 710. For example, the ECC-encoded data may include the modified chunk data including the section data and parity data corresponding to the modified chunk data.

At step S807, the buffer memory device 1300 may write the ECC-encoded chunk data and parity data respectively in the first chunk area 810 and the first parity area 811 of the buffer memory device 1300 under the control of the processor 710.

When a write request for data having a unit smaller than that of an ECC encoding operation is generated, such a write request may be executed through read-modify write operations.

Figure 9:
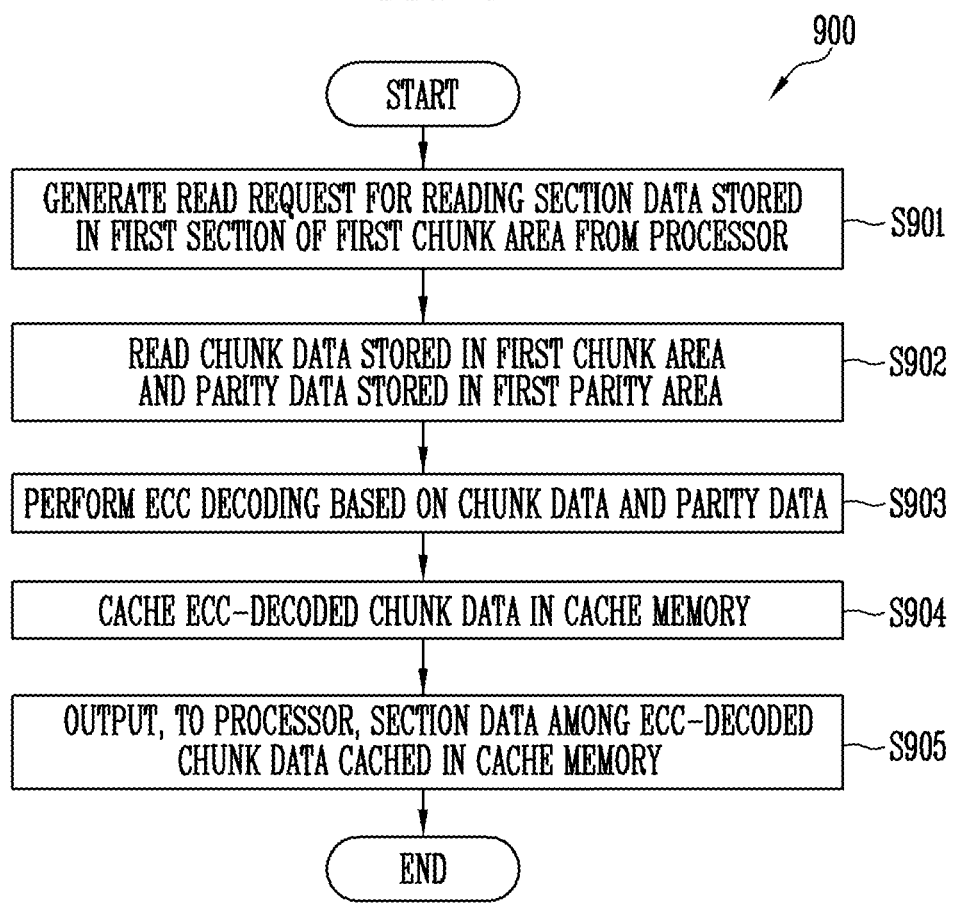
FIG. 9 is a flowchart illustrating a data reading method of a buffer memory device according to an embodiment of the present disclosure.

FIG. 9 is a flowchart illustrating a data reading process 900 of a buffer memory device (e.g., the buffer memory device 1300 of FIG. 1) according to an embodiment of the present disclosure.

Referring to FIG. 9, at step S901, a processor (e.g., the processor 710 of FIG. 2) may generate a read request for reading section data stored in a section (e.g., the first section 801-1 of FIG. 6) of a chunk area (e.g., the first chunk area 810 of FIG. 6).

The processor 710 may generate the read request for the buffer memory device 1300 when a read command for a nonvolatile memory device (e.g., the nonvolatile memory device 1100 of FIG. 1) is input from a host (e.g., the host 2000 of FIG. 1). When a read command for the nonvolatile memory device 1100 and a logical address are received from the host 2000, a memory system (e.g., the memory system 1000 of FIG. 1) may read data stored in the buffer memory device 1300 to determine a physical address of the nonvolatile memory device 1100, which corresponds to the logical address, in response to the read command. For example, the data stored in the buffer memory device 1300 may include information on the physical address mapped to the logical address, i.e., logical-physical address mapping information. In this case, the processor 710 may generate a read request for reading logical-physical address mapping information, which includes a mapping relationship between the logical address and the physical address, from the buffer memory device 1300. In other words, the read request at step S901 may be generated through the above-described process.

At step S902, the processor 710 may read chunk data stored in the first chunk area 810 of the buffer memory device 1300 and parity data stored in the first parity area 811 of the buffer memory device 1300 in response to the read request.

At step S903, an ECC circuit (e.g., the second ECC circuit 750 of FIG. 2) may perform an ECC decoding operation based on the read chunk data and the read parity data under the control of the processor 710. At step S904, the cache memory 720 may cache the ECC-decoded chunk data under the control of the processor 710.

Then, at step S905, a portion of the cached chunk data in the cache memory 720 corresponding to the section data stored in the first section 801-1 may be output to the processor 710.

Figure 10:
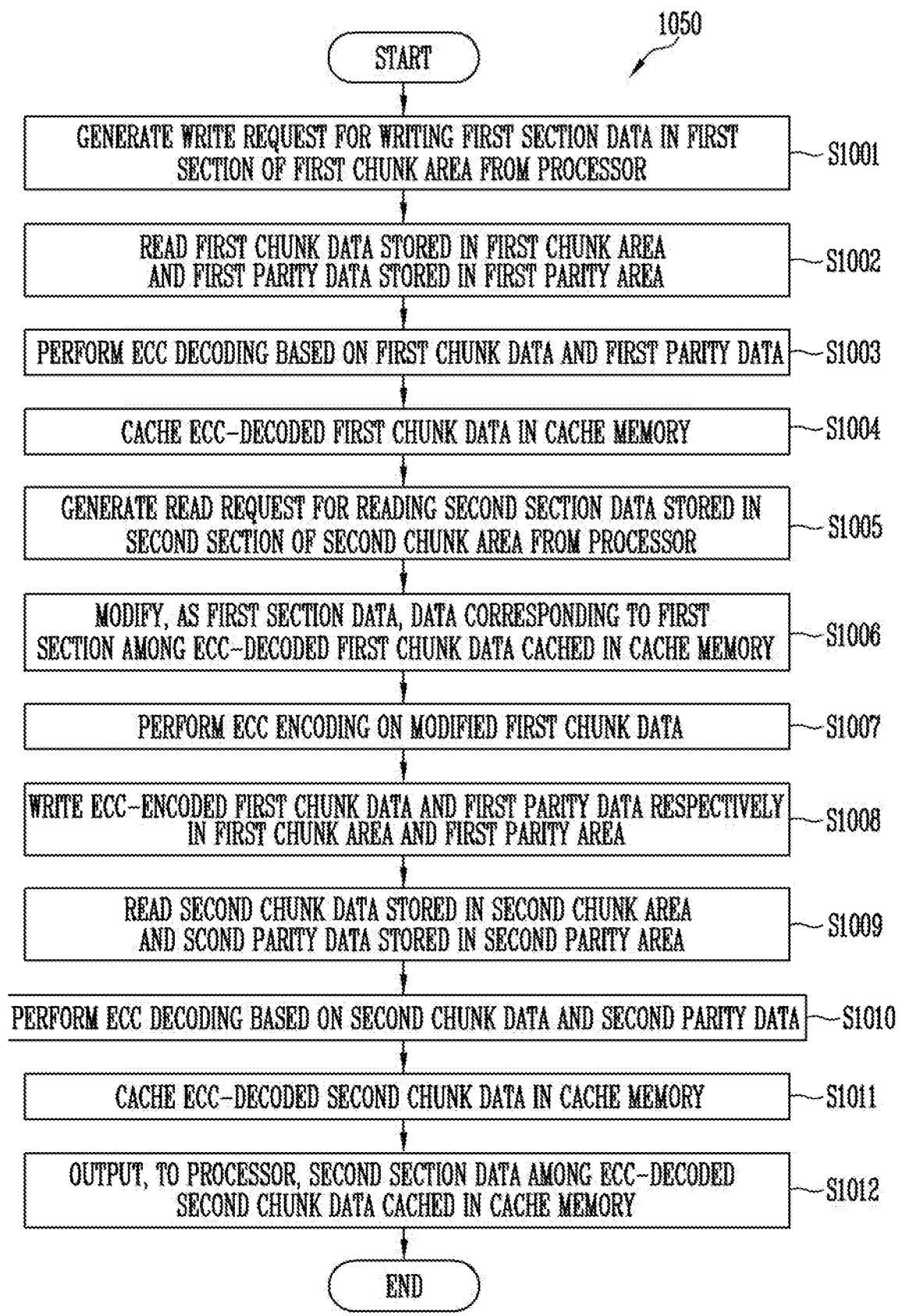
FIG. 10 is a flowchart illustrating a data reading and writing method of a buffer memory device according to an embodiment of the present disclosure.

FIG. 10 is a flowchart illustrating a data reading and writing process 1050 of a buffer memory device (e.g., the buffer memory device 1300 of FIG. 1) according to an embodiment of the present disclosure.

Referring to FIG. 10, at step S1001, a processor (e.g., the processor 710 of FIG. 2) may generate a write request for writing first section data in a section (e.g., the first section

801-1 of FIG. 6) of a first chunk area (e.g., the first chunk area 810 of FIG. 6) of the buffer memory device 1300. At step S1002, the processor 710 may read first chunk data stored in the first chunk area 810 of the buffer memory device 1300 and first parity data stored in the first parity area 811 in response to the write request.

At step S1003, an ECC circuit (e.g., the second ECC circuit 750 of FIG. 2) may perform an ECC decoding operation based on the read first chunk data and the read first parity data under the control of the processor 710. At step S1004, a cache memory (e.g., the cache memory 720 of FIG. 2) may cache the ECC-decoded first chunk data under the control of the processor 710.

Then, at S1005, the processor 710 may generate a read request for reading second section data (or read data) stored in a section (e.g., the second section 802-2 of FIG. 6) of a second chunk area (e.g., the second chunk area 820 of FIG. 6).

At step S1006, the processor 710 may modify a portion of the cached first chunk data corresponding to the first section 801-1 into the first section data. At step S1007, the second ECC circuit 750 may perform an ECC encoding operation on the modified first chunk data including the first section data under the control of the processor 710. For example, the ECC-encoded data may include the modified first chunk data including the first section data and first parity data corresponding to the modified first chunk data. In another example, step S1006 may be performed before step S1005.

At step S1008, the buffer memory device 1300 may write the ECC-encoded first chunk data and first parity data respectively in the first chunk area 810 and the first parity area 811 of the buffer memory device 1300 under the control of the processor 710.

At step S1009, the processor 710 may read second chunk data stored in the second chunk area 820 of the buffer memory device 1300 and second parity data stored in the second parity area 821 of the buffer memory device 1300 in response to the read request.

At step S1010, the second ECC circuit 750 may perform an ECC decoding operation based on the read second chunk data and the read second parity data under the control of the processor 710. At step S1011, the cache memory 720 may cache the ECC-decoded second chunk data under the control of the processor 710.

Then, at step S1012, a portion of the cached second chunk data stored in the cache memory 720 corresponding to the second section data stored in the second section 802-2 of the second chunk area 820 may be output to the processor 710.

Figure 11:
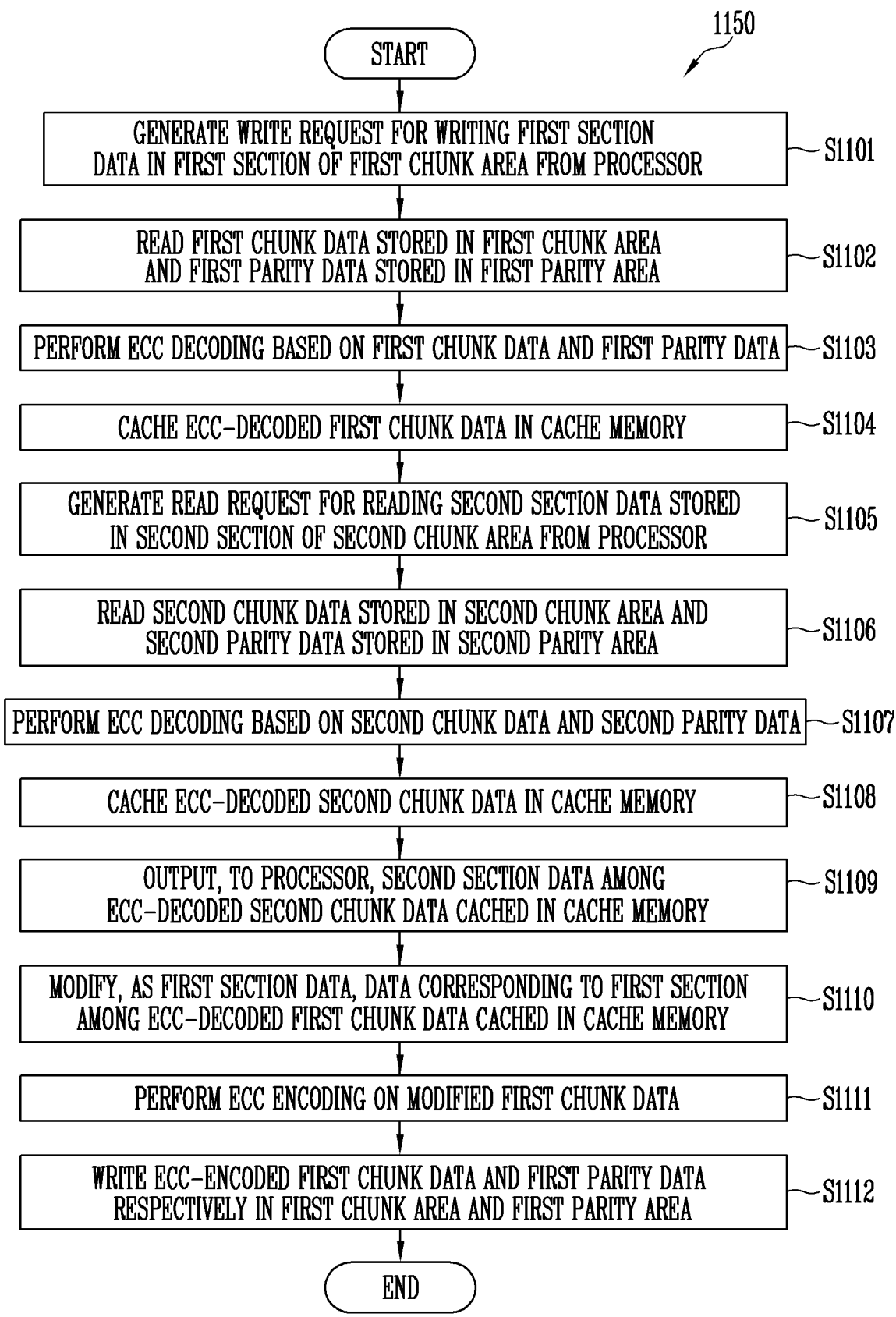
FIG. 11 is a flowchart illustrating a data reading and writing method of a buffer memory device according to an embodiment of the present disclosure.

FIG. 11 is a flowchart illustrating a data reading and writing process 1150 of a buffer memory device (e.g., the buffer memory device 1300 of FIG. 1) according to an embodiment of the present disclosure.

Referring to FIG. 11, at S1101, a processor (e.g., the processor 710 of FIG. 2) may generate a write request for writing first section data in a section (e.g., the first section 801-1 of FIG. 6) of a first chunk area (e.g., the first chunk area 810 of FIG. 6) of the buffer memory device 1300.

The write request for the buffer memory device 1300 from the processor 710 may be generated when a data write command for a memory device (e.g., the nonvolatile memory device 1100) is input from a host (e.g., the host 2000 of FIG. 1). When a write command for the nonvolatile memory device 1100, data, and a logical address are received from the host 2000, a memory system (e.g., the memory system 1000 of FIG. 1) may queue the write command. Also, the memory system 1000 may allocate a physical address of the nonvolatile memory device 1100, which corresponds to the logical address, in response to the write command. At this time, the data input from the host 2000 may be written in a storage area corresponding to the physical address. For example, a write request for writing logical-physical address mapping information including a mapping relationship between the logical address and the physical address in the buffer memory device 1300 may be generated from the processor 710.

At step S1102, the processor 710 may read first chunk data stored in the first chunk area 810 of the buffer memory device 1300 and first parity data stored in the first parity area 811 of the buffer memory device 1300 in response to the write request.

At step S1103, an ECC circuit (e.g., the second ECC circuit 750 of FIG. 2) may perform an ECC decoding operation based on the first chunk data read from the first chunk area 810 and the first parity data read from the first parity area 811. At step S1104, the cache memory 720 may cache the ECC-decoded first chunk data under the control of the processor 710.

Then, at step S1105, the processor 710 may generate a read request for reading second section data stored in a section (e.g., the second section 802-2 of FIG. 6) of a second chunk area (e.g., the second chunk area 820 of FIG. 6).

The read request for the buffer memory device 1300 from the processor 710 may be generated when a read command for the nonvolatile memory device 1100 is input from the host 2000. When a read command for the nonvolatile memory device 1100 and a logical address are received from the host 2000, the memory system 1000 may queue the read command. Also, the memory system 1000 may read data stored in the buffer memory device 1300 to determine a physical address of the nonvolatile memory device 1100, which corresponds to the logical address, in response to the read command. At this time, the data stored in the buffer memory device 1300 may include information on a physical address mapped to the logical address, i.e., logical-physical address mapping information. For example, a read request for reading logical-physical address mapping information including a mapping relationship between the logical address and the physical address from the buffer memory device 1300 may be generated from the processor 710.

The memory system 1000 may first process the read command between the queued write command and the queued read command. In other words, the memory system 1000 may process a plurality of queued commands based on a given order of priority, such that the memory system 1000 first process a command (e.g., the read command) with a higher priority.

At step S1106, the processor 710 may read second chunk data stored in the second chunk area 820 of the buffer memory device 1300 and second parity data stored in the second parity area 821 of the buffer memory device 1300 in response to the read request.

At step S1107, the second ECC circuit 750 may perform an ECC decoding operation based on the read second chunk data and the read second parity data under the control of the processor 710. At step S1108, the cache memory 720 may cache the ECC-decoded second chunk data under the control of the processor 710.

Then, at step S1109, a portion of the cached second chunk data corresponding to the second section data stored in the second section 802-2 of the second chunk area 820 may be output to the processor 710.

At step S1110, the processor 710 may modify a portion of the cached first chunk data corresponding to the first section 801-1 into the first section data. At step S1111, the second ECC circuit 750 may perform an ECC encoding operation on the modified first chunk data including the first section data under the control of the processor 710. For example, the ECC-encoded data may include the modified first chunk data including the first section data and first parity data corresponding to the modified first chunk data.

As another example, step S1110 may be performed between step S1104 and step S1105.

At step S1112, the buffer memory device 1300 may write the ECC-encoded first chunk data and first parity data respectively in the first chunk area 810 and the first parity area 811 of the buffer memory device 1300 under the control of the processor 710.

When a read command and a logical address are input from the host 2000, the memory system 1000 may read logical-physical address mapping information stored in the buffer memory device 1300, and determine a physical address corresponding to the logical address from the read logical-physical address mapping information. Then, the memory system 1000 may read data stored in the nonvolatile memory device 1100, based on the physical address, and output the read data to the host 2000. As an example, it may take a long time for the memory system 1000 to read the logical-physical address mapping information stored in the buffer memory device 1300, and thus the read performance of the memory system 1000 may be deteriorated. Therefore, it is desirable for the memory system 1000 to read the logical-physical address mapping information stored in the buffer memory device 1300 at a high speed.

As described above, the memory system 1000 preferentially processes the read request as compared with the write request, so that latency following the read request can be reduced. Consequently, the read performance of the memory system 1000 can be improved.

Figure 12:
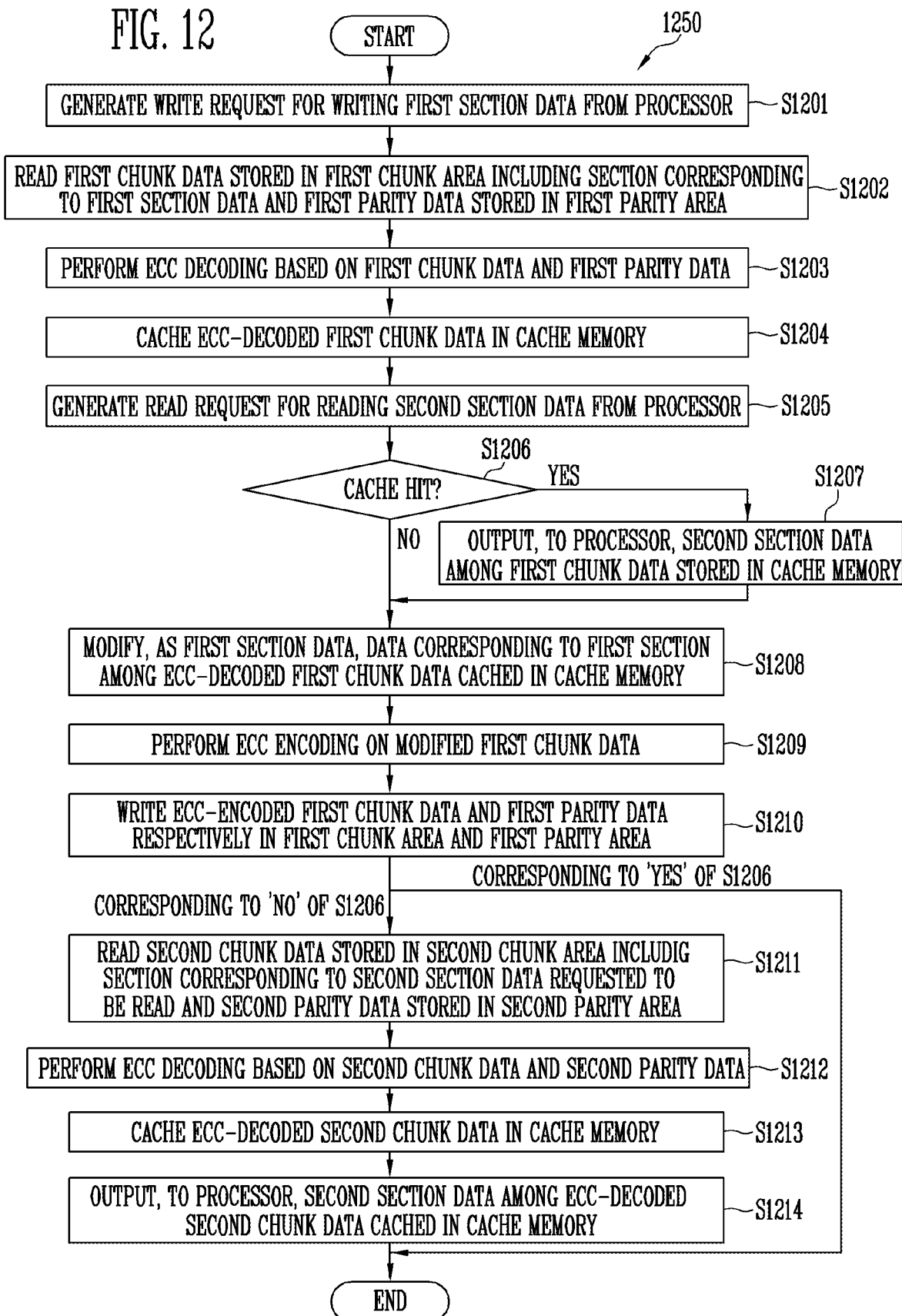
FIG. 12 is a flowchart illustrating a data reading and writing method of a buffer memory device according to an embodiment of the present disclosure.

FIG. 12 is a flowchart illustrating a data reading and writing process 1250 of a buffer memory device (e.g., the buffer memory device 1300 of FIG. 1) according to an embodiment of the present disclosure.

Referring to FIG. 12, at step S1201, a processor (e.g., the processor 710 of FIG. 2) may generate a write request for writing first section data into a section (e.g. the first section 801-1 of FIG. 6) of a chunk area (e.g., the first chunk area 810 of FIG. 6) of the buffer memory device 1300. At step S1202, the processor 710 may read first chunk data stored in the first chunk area 810 of the buffer memory device 1300 and first parity data stored in the first parity area 811 of the buffer memory device 1300 in response to the write request.

At step S1203, an ECC circuit (e.g., the second ECC circuit 750 of FIG. 2) may perform an ECC decoding operation based on the first chunk data read from the first chunk area 810 and the first parity data read from the first parity area 811. At step S1204, a cache memory (e.g., the cache memory 720 of FIG. 2) may cache the ECC-decoded first chunk data under the control of the processor 710.

Then, at step S1205, the processor 710 may generate a read request for reading second section data stored in a section (e.g., the second section 802-1 of the first chunk area 810 or the second section 802-2 of the second chunk area 820 of FIG. 6).

At step S1206, the processor 710 may check whether the second section data requested to be read has been cached in the cache memory 720. When the second section data has been cached in the cache memory 720, i.e., in a cache hit (corresponding to "YES" of step S1206), the cache memory 720 may immediately output the second section data among the ECC-decoded first chunk data stored therein to the processor 710 at step S1207. In other words, the second section data requested to be read is data stored in the second section 802-1 of the first chunk area 810, rather than that stored in the second section 802-2 of the second chunk area 820.

At step S1208, the processor 710 may modify a portion of the cached first chunk data corresponding to the first section 801-1 into the first section data. At step S1209, the second ECC circuit 750 may perform an ECC encoding operation on the modified first chunk data including the first section data under the control of the processor 710. For example, the ECC-encoded data may include the modified first chunk data including the first section data and first parity data corresponding to the modified first chunk data. In another example, step S1208 may be performed between step S1204 and step S1205. As a result, step S1209 may be performed immediately after step S1207.

At step S1210, the buffer memory device 1300 may write the ECC-encoded first chunk data and first parity data respectively in the first chunk area 810 and the first parity area 811 of the buffer memory device 1300 under the control of the processor 710.

When the cache memory 720 contains the second section data to be read, i.e., in the cache hit (corresponding to "YES" of step S1206), the process 1250 is completed after step S1210. Both of the write request and the read request may be executed through the above-described steps.

When the second section data requested to be read does not exist in the cached first chunk data in the cache memory 720, i.e., in a cache miss (corresponding to "NO" of step S1206), steps S1208, S1209, and S1210 may be performed without performing step S1207. For example, the second section data requested to be read is data stored in the second section 802-2 of the second chunk area 820, rather than in the second section 802-1 of the first chunk area 810.

Then, at step S1211, second chunk data stored in the second chunk area 820 including the second section data requested to be read and second parity data stored in the second parity area 821 may be read.

At step S1212, the second ECC circuit 750 may perform an ECC decoding operation based on the read second chunk data and the read second parity data under the control of the processor 710. At step S1213, the cache memory 720 may cache the ECC-decoded second chunk data under the control of the processor 710.

Then, at step S1214, the second section data among the ECC-decoded second chunk data stored in the cache memory 720 may be output to the processor 710.

When the cache memory 720 does not contain the second section data to be read, i.e., in the cache miss (corresponding to "NO" of step S1206), the process 1250 is completed after step S1214. Both of the write request and the read request may be executed through the above-described steps.

As described above, when data to be read in response to a read request exists among data that the memory system 1000 has read from the buffer memory device 1300 and stored in the cache memory 720 in response to a write request, i.e., in a cache hit, the memory system 1000 may output the data to be read directly from the cache memory 720, rather than performing a separate operation of reading data from the buffer memory device 1300. Thus, latency following the read request can be reduced. Consequently, the read performance of the memory system 1000 can be improved.

Figure 13:
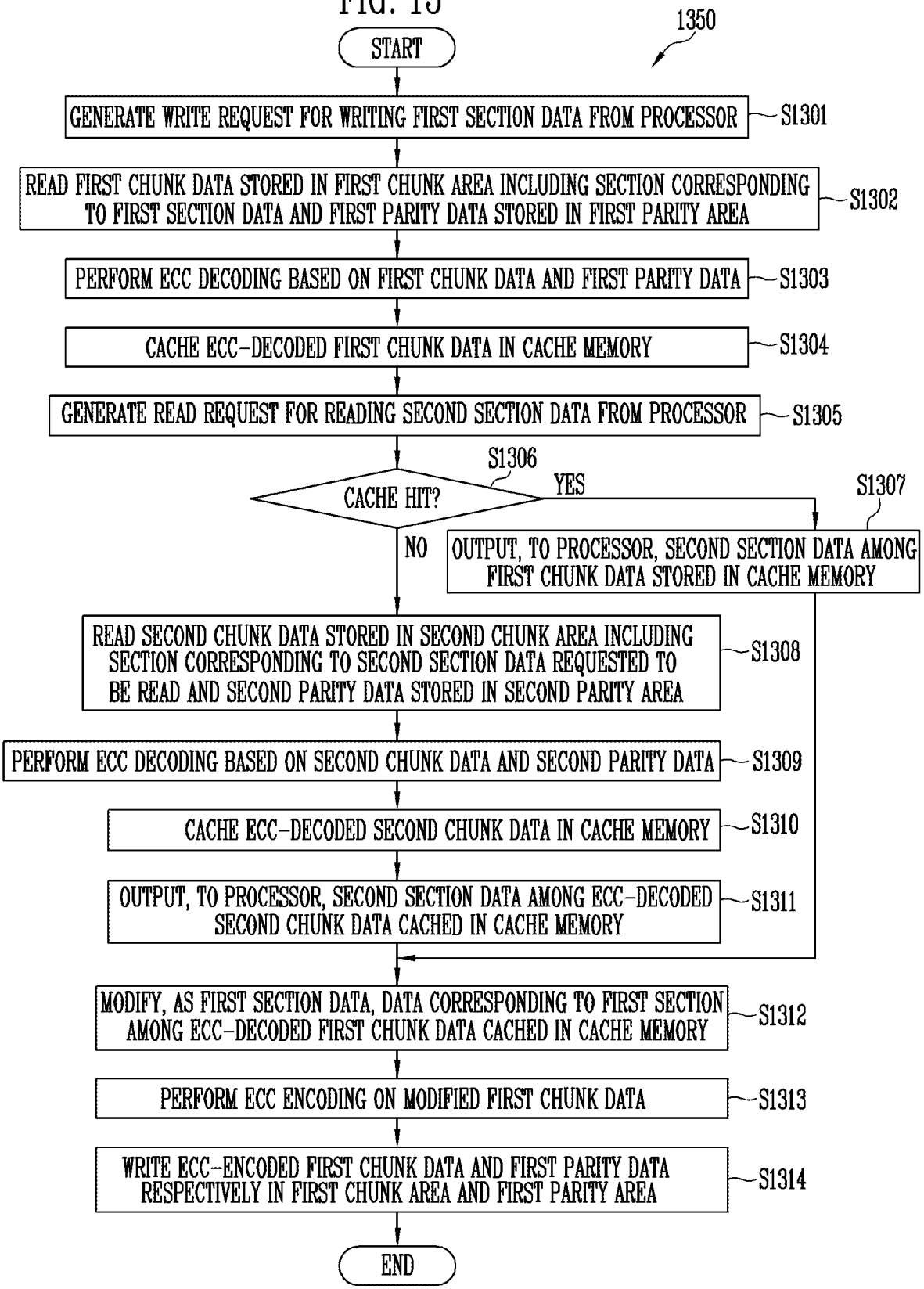
FIG. 13 is a flowchart illustrating a data reading and writing method of a buffer memory device according to an embodiment of the present disclosure.

FIG. 13 is a flowchart illustrating a data reading and writing process 1350 of a buffer memory device (e.g., the buffer memory device 1300 of FIG. 1) according to an embodiment of the present disclosure.

Referring to FIG. 13, at step S1301, a processor (e.g., the processor 710 of FIG. 2) may generate a write request for writing first section data in a section (e.g., the first section 801-1 of FIG. 6) of a chunk area (e.g. the first chunk area 810 of FIG. 6) of the buffer memory device 1300. At step S1302, the processor 710 may read first chunk data stored in the first chunk area 810 of the buffer memory device 1300 and first parity data stored in the first parity area 811 of the buffer memory device 1300 in response to the write request.

At step S1303, an ECC circuit (e.g., the second ECC circuit 750 of FIG. 2) may perform an ECC decoding operation based on the first chunk data read from the first chunk area 810 and the first parity data read from the first parity area 811. At step S1304, the cache memory 720 may cache the ECC-decoded first chunk data under the control of the processor 710.

Then, at step S1305, the processor 710 may generate a read request for reading second section data stored in a section (e.g, the second section 802-1 of the first chunk area 810 or the second section 802-2 of the second chunk area 820 of FIG. 6).

At step S1306, the processor 710 may check whether the second section data requested to be read has been cached in the cache memory 720. When the second section data has been cached in the cache memory 720, i.e., in a cache hit (corresponding to "YES" of step S1306), the cache memory 720 may output the second section data among the ECC-decoded first chunk data stored therein to the processor 710 at step S1307. In other words, the second section data requested to be read is data stored in the second section 802-1 of the first chunk area 810, rather than that stored in the second section 802-2 of the second chunk area 820.

At step S1312, the processor 710 may modify a portion of the cached first chunk data corresponding to the first section 801-1 into the first section data. At step S1313, the second ECC circuit 750 may perform an ECC encoding operation on the modified first chunk data including the first section data under the control of the processor 710. For example, the ECC-encoded data may include the modified first chunk data including the first section data and first parity data corresponding to the modified first chunk data. In another example, step S1312 may be performed between step S1304 and step S1305. As a result, step S1313 may be performed immediately after step S1311.

At step S1314, the buffer memory device 1300 may write the ECC-encoded first chunk data and first parity data respectively in the first chunk area 810 and the first parity area 811 of the buffer memory device 1300 under the control of the processor 710.

When the cache memory 720 contains the second section data to be read, i.e., in the cache hit (corresponding to "YES" of step S1306), the process 1350 is completed after step S1314. Both of the write request and the read request may be executed through the above-described steps.

When the second section data requested to be read does not exist in the cached first chunk data in the cache memory 720, i.e., in a cache miss (corresponding to "NO" of step S1306), steps S1308, S1309, S1310, and S1311 may be performed without performing step S1307. At step S1308, second chunk data stored in the second chunk area 820 including the second section data requested to be read and second parity data stored in the second parity area 821 may be read.

At step S1309, the second ECC circuit 750 may perform an ECC decoding operation based on the read second chunk data and the read second parity data under the control of the processor 710. At step S1310, the cache memory 720 may cache the ECC-decoded second chunk data under the control of the processor 710.

Then, at step S1311, the second section data among the ECC-decoded second chunk data stored in the cache memory 720 may be output to the processor 710.

Steps S1312 to S1314 may be performed after the step S1311. When the cache memory 720 does not contain the second section data to be read, i.e., in the cache miss (corresponding to "NO" of step S1306), the process 1350 is completed after step S1314. Both of the write request and the read request may be executed through the above-described steps.

As described above, when data to be read in response to a read request exists among data that the memory system 1000 has read in response to a write request and stored in the cache memory 720, i.e., in a cache hit, the memory system 1000 may output the data to be read from the cache memory 720, rather than performing a separate operation of reading data from the buffer memory device 1300. Thus, latency following the read request can be reduced. Consequently, the read performance of the memory system 1000 can be improved.

Further, in the cache miss, the memory system 1000 preferentially processes the read request as compared with the write request, so that latency following the read request can be reduced. Consequently, the read performance of the memory system 1000 can be improved.

Figure 14:
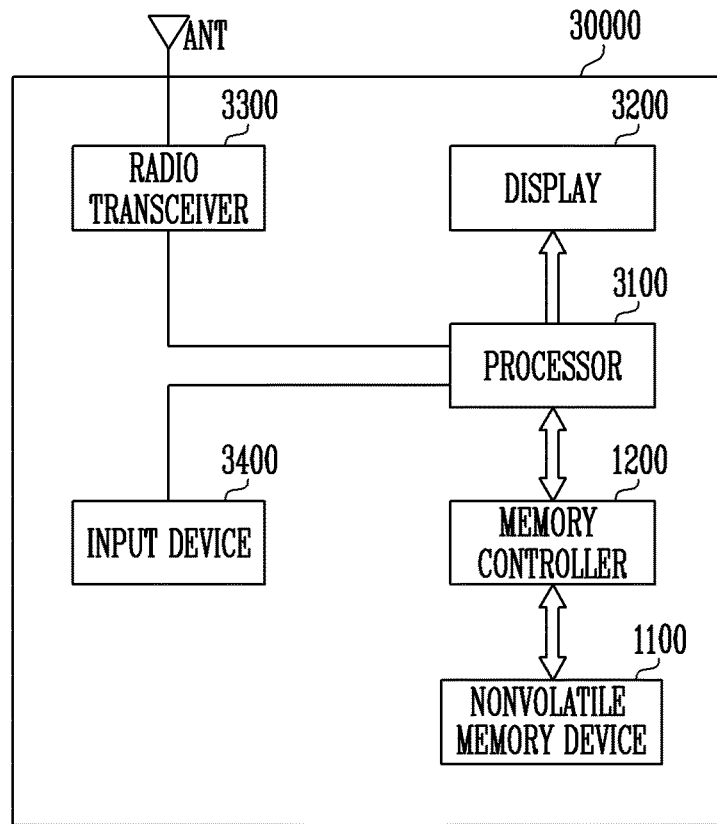
FIG. 14 is a diagram illustrating a memory system including the memory controller of FIG. 2 according to an embodiment.

FIG. 14 is a diagram illustrating a memory system 30000 including the memory controller 1200 of FIG. 2 according to an embodiment.

Referring to FIG. 14, the memory system 30000 may be implemented as a cellular phone, a smart phone, a tablet PC, a personal digital assistant (PDA), or a wireless communication device. The memory system 30000 may include a nonvolatile memory device 1100 and a memory controller 1200 capable of controlling an operation of the nonvolatile memory device 1100. The memory controller 1200 may control a data access operation of the nonvolatile memory device 1100, e.g., a program operation, an erase operation, or a read operation under the control of a processor 3100.

Data programmed in the nonvolatile memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the nonvolatile memory device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the nonvolatile memory device 1100 may be implemented as a part of the processor 3100, or be implemented as a chip separate from the processor 3100. Also, the memory controller 1200 may be implemented with the memory controller shown in FIG. 2.

Figure 15:
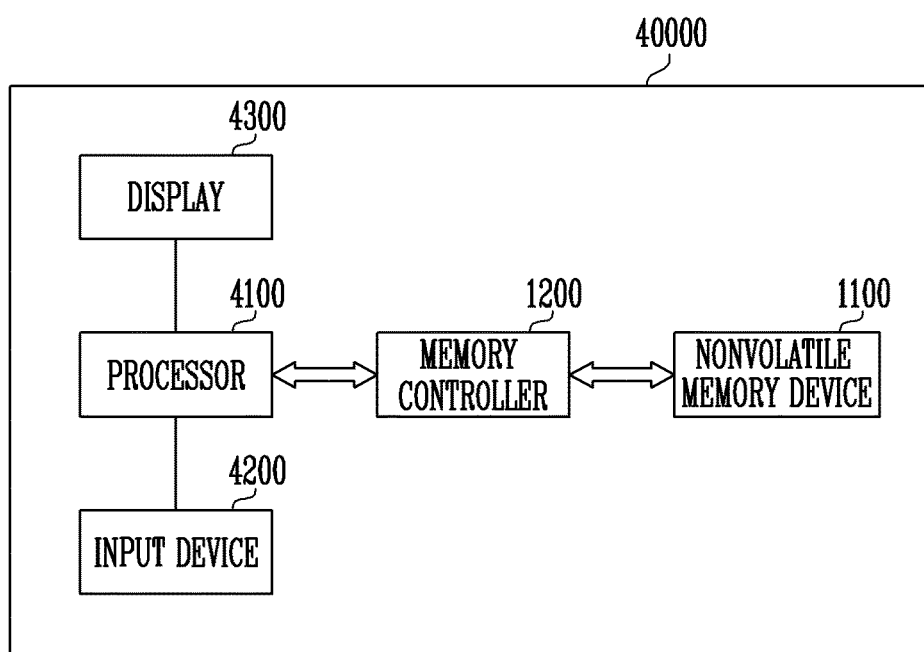
FIG. 15 is a diagram illustrating a memory system including the memory controller of FIG. 2 according to an embodiment.

FIG. 15 is a diagram illustrating a memory system 40000 including the memory controller 1200 of FIG. 2 according to an embodiment.

Referring to FIG. 15, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a nonvolatile memory device 1100 and a memory controller 1200 capable of controlling a data processing operation of the nonvolatile memory device 1100.

The processor 4100 may output data stored in the nonvolatile memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the nonvolatile memory device 1100 may be implemented as a part of the processor 4100, or be implemented as a chip separate from the processor 4100. Also, the memory controller 1200 may be implemented with the memory controller shown in FIG. 2.

Figure 16:
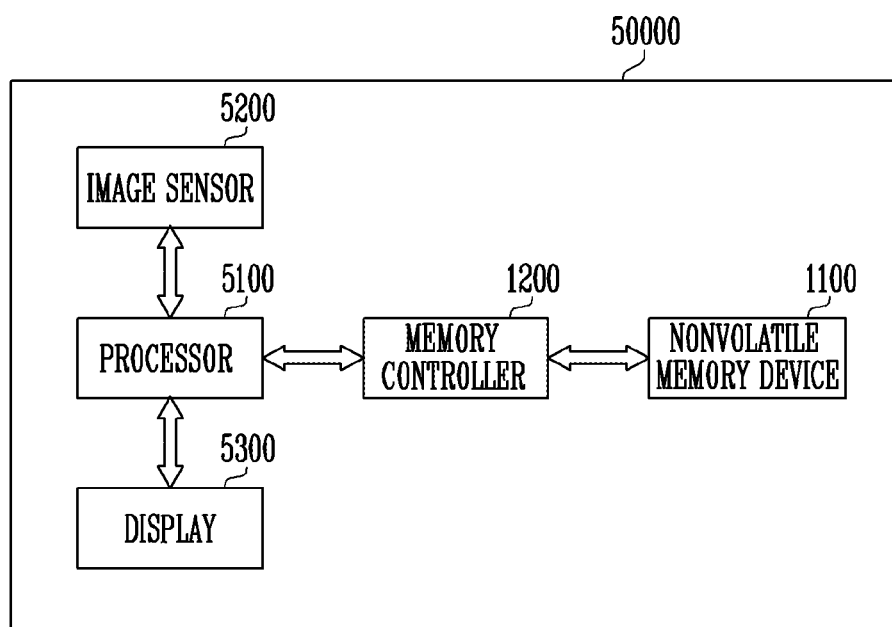
FIG. 16 is a diagram illustrating a memory system including the memory controller of FIG. 2 according to an embodiment.

FIG. 16 is a diagram illustrating a memory system 50000 including the memory controller 1200 of FIG. 2 according to an embodiment.

Referring to FIG. 16, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a nonvolatile memory device 1100 and a memory controller 1200 capable of controlling a data processing operation of the nonvolatile memory device 1100, e.g., a program operation, an erase operation, or a read operation.

An image sensor 5200 of the memory system 50000 may convert an optical image into digital signals, and the converted digital signals may be transmitted to the processor 5100 or the memory controller 1200. Under the control of the processor 5100, the converted digital signals may be output through a display 5300, or be stored in the nonvolatile memory device 1100 through the memory controller 1200. In addition, data stored in the nonvolatile memory device 1100 may be output through the display 5300 under the control of the processor 5100 or the memory controller 1200.

In some embodiments, the nonvolatile memory controller 1200 capable of controlling an operation of the nonvolatile memory device 1100 may be implemented as a part of the processor 5100, or be implemented as a chip separate from the processor 5100. Also, the memory controller 1200 may be implemented with the memory controller shown in FIG. 2.

Figure 17:
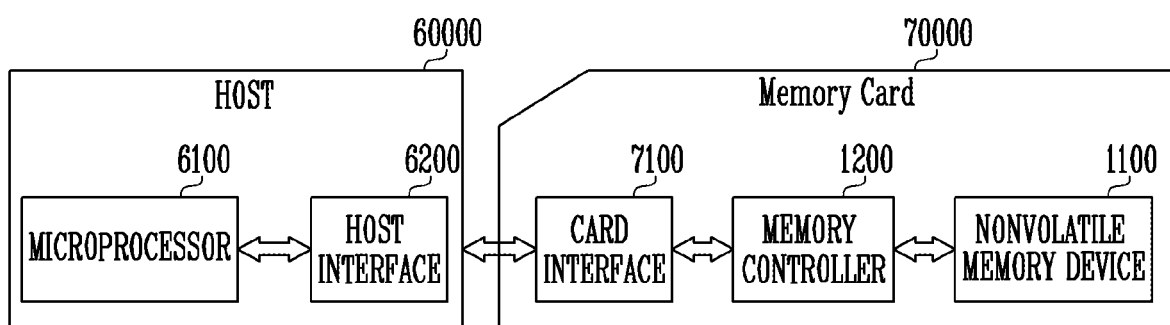
FIG. 17 is a diagram illustrating a memory system including the memory controller of FIG. 2 according to an embodiment.

FIG. 17 is a diagram illustrating a memory system 70000 including the memory controller 1200 of FIG. 2 according to an embodiment.

Referring to FIG. 17, the memory system 70000 may be implemented as a memory card or a smart card. The memory system 70000 may include a nonvolatile memory device 1100, a memory controller 1200, and a card interface 7100.

The memory controller 1200 may control data exchange between the nonvolatile memory device 1100 and the card interface 7100. In some embodiments, the card interface 7100 may be a secure digital (SD) card interface or a multi-media card (MMC) interface, but the present disclosure is not limited thereto. Also, the memory controller 1200 may be implemented with the memory controller shown in FIG. 2.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the nonvolatile memory device 1100 through the card interface 7100 and the memory controller 1200 under the control of a microprocessor 6100.

According to the present disclosure, in an operation of the memory system, it is possible to reduce the time required to read data stored in the buffer memory device, using the cache memory.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a memory system, the method comprising:
    generating a write request for write data;
    reading chunk data from a buffer memory in response to the write request;
    caching the chunk data in a cache memory;
    generating a read request for read data; and
    outputting a portion of the cached chunk data as the read data from the cache memory when the read data is included in the cached chunk data.

2. The method of claim 1, further comprising:
    modifying the cached chunk data based on the write data; and
    writing the modified chunk data in the buffer memory after outputting the read data.

3. The method of claim 2, further comprising:
    reading parity data corresponding to the chunk data; and performing an error correction code (ECC) decoding operation based on the chunk data and the parity data.

4. The method of claim 3, wherein caching the chunk data includes caching the ECC-decoded chunk data in the cache memory.

5. The method of claim 2, wherein writing the modified chunk data includes:
generating error correction code (ECC)-encoded chunk data and parity data by performing an ECC encoding operation on the modified chunk data; and
writing the ECC-encoded chunk data and the parity data in the buffer memory.

6. The method of claim 1, wherein the chunk data includes logical-physical address mapping information on a nonvolatile memory device.

7. The method of claim 1, further comprising:
receiving a write command and a logical address from a host; and
allocating a physical address of a nonvolatile memory device in response to the write command, the physical address corresponding to the logical address,
wherein the write data includes mapping information between the logical address and the physical address.

8. The method of claim 1, further comprising receiving a read command and a logical address from a host,
wherein the read data includes information on a physical address of a nonvolatile memory device, the physical address corresponding to the logical address.

9. The method of claim 1, wherein the cached chunk data in the cache memory is first chunk data, the method further comprising:
reading second chunk data including the read data and parity data corresponding to the second chunk data from the buffer memory when the read data is not included in the first chunk data cached in the cache memory;
performing an error correction code (ECC) decoding operation based on the second chunk data and the parity data; and
caching the ECC-decoded second chunk data in the cache memory; and
outputting a portion of the second chunk data as the read data.

10. The method of claim 9, further comprising:
modifying the cached first chunk data based on the write data; and
writing the modified first chunk data in the buffer memory after outputting the portion of the second chunk data as the read data.

11. A method for operating a memory system, the method comprising:
generating a write request for write data;
reading first chunk data from a buffer memory in response to the write request and caching the read first chunk data in a cache memory;
generating a read request for read data;
reading second chunk data from the buffer memory in response to the read request and caching the read second chunk data in the cache memory;
outputting a portion of the cached second chunk data as the read data;
modifying the cached first chunk data based on the write data; and
writing the modified first chunk data in the buffer memory after outputting the read data.

12. The method of claim 11, further comprising:
reading parity data corresponding to the first chunk data; and
performing an error correction code (ECC) decoding operation based on the first chunk data and the parity data.

13. The method of claim 11, further comprising generating parity data by performing an error correction code (ECC) encoding operation on the modified first chunk data.

14. The method of claim 11, wherein one or both of the first chunk data and the second chunk data include logical-physical address mapping information on a nonvolatile memory device.

15. The method of claim 11, wherein the buffer memory includes a Dynamic Random Access Memory (DRAM), and the cache memory includes a Static Random Access Memory (SRAM).

* * * * *